United States Patent [19]

Mimura

[11] Patent Number: 4,732,870
[45] Date of Patent: Mar. 22, 1988

[54] METHOD OF MAKING COMPLEMENTARY FIELD EFFECT TRANSISTORS

[75] Inventor: Takashi Mimura, Machida, Japan

[73] Assignee: Fujitsu Limited, Kanagawa, Japan

[21] Appl. No.: 84,052

[22] Filed: Aug. 11, 1987

Related U.S. Application Data

[62] Division of Ser. No. 745,160, Jun. 17, 1985.

[30] Foreign Application Priority Data

Jun. 18, 1984 [JP] Japan .................................. 59-123755

[51] Int. Cl.$^4$ .................. H01L 21/203; H01L 21/205; H01L 21/265
[52] U.S. Cl. ........................................ 437/40; 437/57; 437/107; 437/133
[58] Field of Search ..................... 437/57, 107, 133, 40

[56] References Cited

U.S. PATENT DOCUMENTS

| | | | |
|---|---|---|---|
| 3,673,471 | 6/1972 | Klein et al. ........................ | 29/571 X |
| 4,151,635 | 5/1979 | Kashkooli et al. ................... | 29/571 |
| 4,538,165 | 8/1985 | Chang et al. ........................ | 357/22 |
| 4,583,105 | 4/1986 | Rosenberg ........................ | 357/23.12 |

FOREIGN PATENT DOCUMENTS

| | | |
|---|---|---|
| 0033037 | 8/1981 | European Pat. Off. . |
| 0055968 | 7/1982 | European Pat. Off. . |
| 57-7165 | 1/1982 | Japan . |
| 58-51574 | 3/1983 | Japan . |
| 58-147167 | 9/1983 | Japan . |

OTHER PUBLICATIONS

Patent Abstracts of Japan, vol. 8, No. 161 (E-257), [1598], 26th Jul. 1984; & JP-A-59, 61166 (Fujitsu K.K.), Apr. 7, 1984.

Patent Abstracts of Japan, vol. 7, No. 264 (E-212), [1409], 24th Nov. 1983; & JP-A-58 147167 (Fujitsu K.K.), Sep. 1, 1983.

Patents Abstracts of Japan, vol. 7, No. 136, (E-181), [1281], 14th Jun. 1983; & JP-A-58 51574 (Fujitsu K.K.), 26-03-1983.

Primary Examiner—George T. Ozaki
Attorney, Agent, or Firm—Armstrong, Nikaido, Marmelstein & Kubovcik

[57] ABSTRACT

A semiconductor device, e.g., a complementary circuit comprising an n-channel transistor ($Q_n$) utilizing a two-dimensional electron gas and a p-channel transistor ($Q_p$) utilizing a two-dimensional hole gas, comprises: a semi-insulating GaAs substrate; a channel layer of an i-type GaAs having n+-type source and drain regions and p+-type source and drain regions; a buffer layer of an i-type AlGaAs preventing carriers from passing therethrough; first and second control layers of GaAs or AlGaAs having n-type or p-type conductivity, these layers being epitaxially formed in sequence on the substrate by an MBE method or an MOCVD method; and metal electrodes formed on the first and second control layers, n+-type regions and p+-type regions.

7 Claims, 14 Drawing Figures

METHOD OF MAKING COMPLEMENTARY FIELD EFFECT TRANSISTORS

This is a division of application Ser. No. 745,160 filed June 17, 1985.

BACKGROUND OF THE INVENTION

1. Field of the Invention

The present invention relates to a semiconductor device (e.g., a complementary circuit) comprising an n-channel transistor and a p-channel transistor.

2. Description of the Related Art

Japanese Unexamined Patent Publication (Kokai) No. 57-7165 filed on June 17, 1980, by the present inventor, disclosed a high speed semiconductor device having a heterojunction formed between two semiconductor layers having different electron affinities, e.g., a gallium arsenide (GaAs) layer and an aluminum gallium arsenide (AlGaAs) layer, and using a two-dimensional gas layer (i.e., an electron accumulating layer) generated at the heterojunction interface. In this semiconductor device a control electrode corresponding to a gate electrode and controlling an electron density of the two-dimensional layer is formed on the AlGaAs electron supply layer. The impedance of the two-dimensional layer in the GaAs layer between a source electrode and a drain electrode can be varied by a voltage applied to the control electrode.

In the above-mentioned semiconductor device, however, since the AlGaAs layer is a semiconductor having a small electron affinity, i.e., a large energy gap, contains donor impurities (i.e., the AlGaAs layer has n-type conductivity), the donor impurities diffuse into the GaAs layer, which is a semiconductor having a large electron affinity, i.e., a small energy gap. Thus, the diffused impurities hinder the improvement of the electron mobility of the two-dimensional electron gas layer.

To overcome the above-mentioned disadvantage of the semiconductor device, in Japanese Unexamined Patent Publication (Kokai) No. 58-51574, filed on Sept. 22, 1981, the present inventor proposed to insert a buffer layer of undoped AlGaAs between the GaAs layer and the n-type GaAs layer. Such an improved semiconductor device is illustrated in FIG. 1. The semiconductor device comprises a semi-insulating GaAs substrate 1, an i-type GaAs channel layer 2, an i-type AlGaAs buffer layer 3, an n-type GaAs control layer 4, a control electrode (gate electrode) 5, an n+-type source region 6, an n+-type drain region 7, a source electrode 8, and a drain electrode 9. In this case, since the energy gap of the control layer 4 must be not more than that of the i-type GaAs channel layer 2, GaAs is selected for the material of the control layer 4. The material, impurity density, and thickness of the control layer 4 are adjusted to the optimum conditions to bring the surface potential of the GaAs channel layer 2 at the interface between the GaAs channel layer 2 and the i-type AlGaAs buffer layer 3 to 0 volt under thermal equilibrium conditions. When a positive voltage is applied to the control electrode 5, a two-dimensional electron gas layer (electron accumulating layer) 10 is generated in the channel layer 2 near the heterojunction interface, as shown in FIG. 1. The two-dimensional electron gas layer 10 serves as a channel below the control (gate) electrode 5, and thus the semiconductor device operates at a high speed in an enhancement-mode.

To increase the performance of an integrated circuit, it is important to decrease the power consumption thereof in addition to increasing the operating speed. To this end, in Japanese Unexamined Patent Publication (Kokai) No. 58-147167 filed on Feb. 26, 1982, the present inventor proposed a complementary semiconductor device comprising an n-channel transistor utilizing a two-dimensional electron gas and a p-channel transistor utilizing a two-dimensional hole gas. In this case, since either an n-type AlGaAs electron supply layer or a p-type AlGaAs hole supply layer is not sequentially formed on a GaAs channel layer, a heterojunction between the channel layer and the n-type AlGaAs layer or the p-type AlGaAs layer does not reach a sufficient level of excellence.

SUMMARY OF THE INVENTION

An object of the present invention is to provide an improved semiconductor device (e.g., a complementary circuit) comprising an n-channel transistor utilizing a two-dimensional electron gas and a p-channel transistor utilizing a two-dimensional hole gas.

Another object of the present invention is to provide excellent heterojunctions of a channel layer at both the n-channel and p-channel transistors.

Yet another object of the present invention is to provide a semiconductor device in which a carrier (i.e., electrons or holes) forming a two-dimensional electron (or hole) gas layer is supplied from a source region instead of a conventional electron (or hole) supply layer.

A further object of the present invention is to provide a method of producing the improved semiconductor device.

The above and other objects of the present invention are attained by providing a semiconductor device which comprises, an n-channel transistor and a p-channel transistor, comprising: (a) an semi-insulating single crystalline substrate; (b) a channel layer of an undoped single crystalline semiconductor formed on the substrate, and having a pair of n-type impurity regions sandwiching an n-channel region of a two-dimensional electron gas layer for the n-channel transistor, and a pair of p-type impurity regions sandwiching a p-channel region of a two-dimensional hole gas layer for the p-channel transistor; (c) a buffer layer of an undoped single crystalline semiconductor having an energy gap larger than that of the channel layer (b) and formed on the n-channel and p-channel regions of the channel layer (b); (d) a first control layer of a doped single crystalline semiconductor formed on the buffer layer (c) above the n-channel region; (e) a second control layer of a doped single crystalline semiconductor layer formed on the buffer layer (c) above the p-channel region; and (f) electrodes formed on the first and second control layers, n-type impurity regions, and p-type impurity regions.

It is preferable that the materials of the substrate, channel layer, and buffer layer be GaAs, GaAs, and AlGaAs, respectively, and that they are sequentially formed.

The term "undoped" in the undoped channel layer and the undoped buffer layer, as used herein, means that these layers are formed without an intentional doping of impurities.

It is preferable that the thickness of the buffer layer of undoped AlGaAs be from 5 to 500 nm.

The first control layer and second control layer are made of either GaAs or AlGaAs and have either n-type or p-type conductivity, respectively.

BRIEF DESCRIPTION OF THE DRAWINGS

The present invention will be more apparent from the description of the preferred embodiments set forth below, with reference to the accompanying drawings, in which.

DESCRIPTION OF THE PREFERRED EMBODIMENTS

Figure 1:
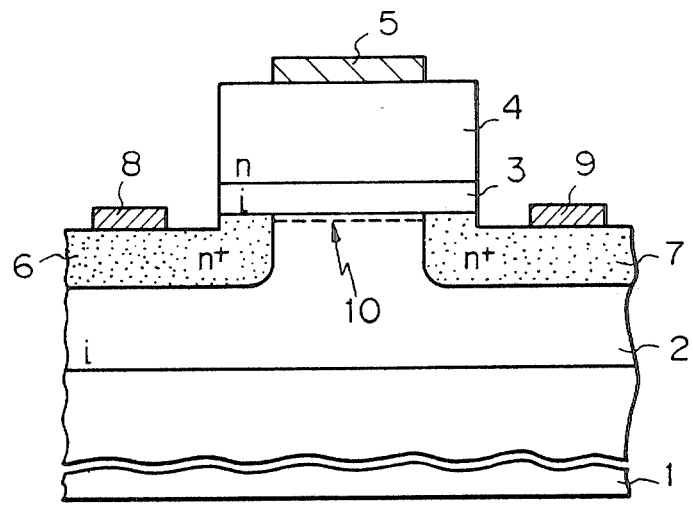
FIG. 1 is a schematic sectional view of a conventional semiconductor device comprising an n-channel transistor.
Figure 3:
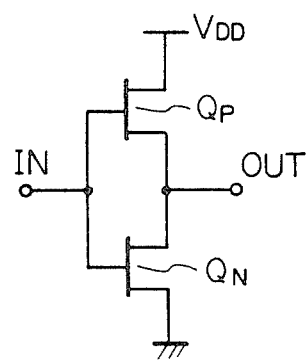
FIG. 3 is an complementary circuit of the complementary semiconductor device of FIG. 2.
Figure 2:
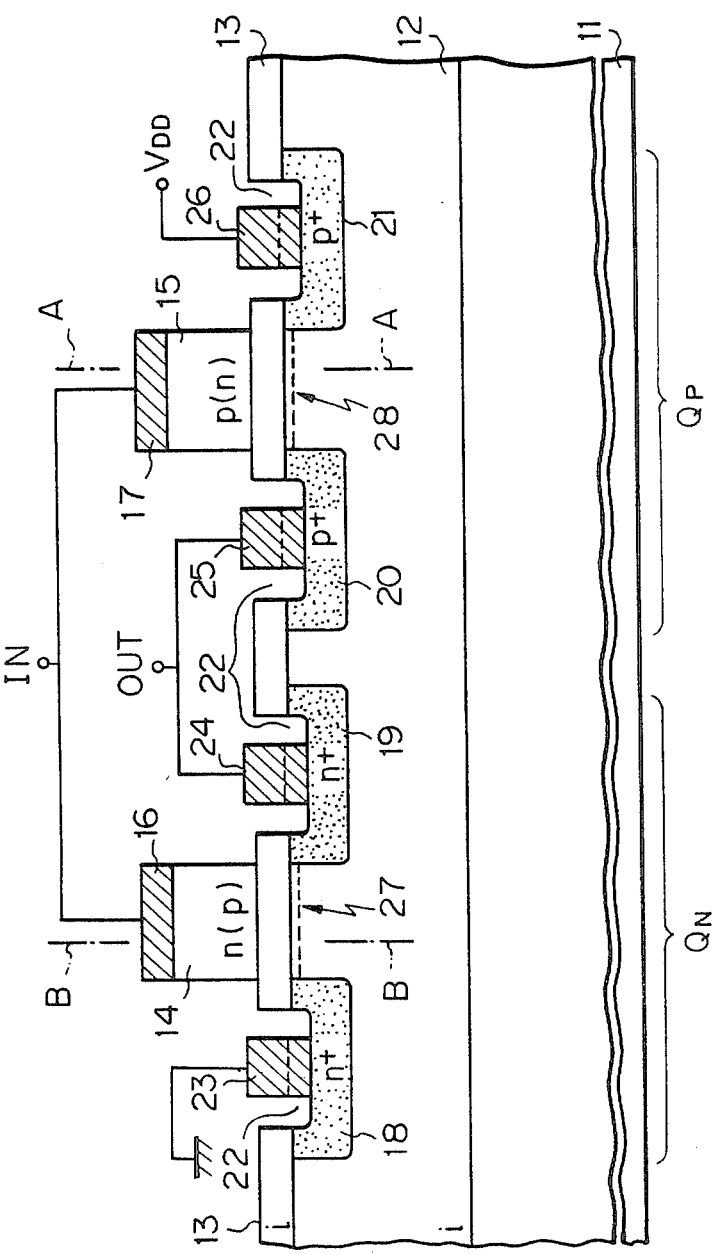
FIG. 2 is a schematic sectional view of a complementary semiconductor device comprising an n-channel transistor utilizing a two-dimensional electron gas layer and a p-channel transistor utilizing a two-dimensional hole gas layer according to the present invention.

Referring to FIG. 2, a complementary semiconductor device according to the present invention comprises an n-channel transistor $Q_n$ and a p-channel transistor $Q_p$ and has a complementary circuit as shown in FIG. 3.

The n-channel transistor $Q_n$ and the p-channel transistor $Q_p$ have a semi-insulating GaAs substrate 11, an i-type GaAs channel layer 12, and an i-type AlGaAs buffer layer 13 in common. The buffer layer 13 is of, e.g., undoped $Al_xGa_{1-x}As$ (x=0.3), and has a thickness of from 5 to 500 nm. According to the present invention the thickness of the i-type AlGaAs buffer layer is suitable for preventing the carrier (i.e., electrons or holes) from passing therethrough.

The buffer layer 13 and the channel layer 12 form an excellent interface, i.e., heterojunction, because of the sequential formation thereof.

The n-channel transistor $Q_n$ comprises a doped GaAs layer 14 on the buffer layer 13, a control (gate) electrode 16, an $n^+$-type source region 18 and an $n^+$-type drain region 19 formed in the channel layer 12, a source electrode 23, and a drain electrode 24. In the transistor $Q_n$ an n-channel region 27 of a two-dimensional electron gas is generated in the channel layer 12, near the heterojunction, and between the source and drain regions 18 and 19.

The p-channel transistor $Q_p$ comprises a doped GaAs layer 15 on the buffer layer 13, a control (gate) electrode 17, a $p^+$-type source region 20 and a $p^+$-type drain region 21 formed in the channel layer 12, a source electrode 25, and a drain electrode 26. In the transistor $Q_p$ a p-channel region 28 of a two-dimensional hole gas is generated in the channel layer 12, near the heterojunction, and between the source and drain regions 20 and 21.

It is possible to make the control layers 14 and 15 of AlGaAs instead of GaAs, since it is unnecessary to restrict the control layers to a semiconductor having an energy gap not larger than that of the channel layer. The control layers 14 and 15 of a doped semiconductor may have n-type conductivity or p-type conductivity, namely, may contain donor or acceptor impurities. Accordingly, it is possible, for example, to form a GaAs layer 14 having p-type conductivity above the n-channel region 27, and to form a GaAs layer 15 having n-type conductivity above the p-channel region 28. Furthermore, the control electrodes 16 and 17 are in ohmic contact with the control layers 14 and 15, respectively. Therefore, the control electrode 16 (or 17) and the control layer 14 (or 15) serve as one gate electrode.

Referring to FIGS. 4 to 7, a method of producing the semiconductor device illustrated in FIG. 2 is now explained.

Figure 4:
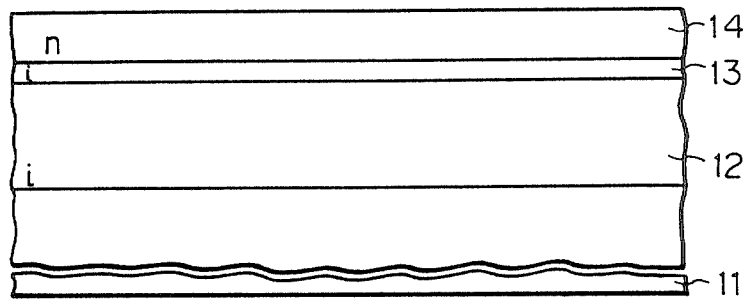
FIGS. 4 to 8 are schematic sectional views of the complementary semiconductor device shown in FIG. 2, in various stages of production in accordance with the present invention.

As illustrated in FIG. 4, on the semi-insulating GaAs substrate 11, the i-type (undoped) GaAs channel layer 12, the i-type (undoped) AlGaAs buffer layer 13, and the n-type (doped) GaAs control layer 14 are epitaxially and sequentially formed by a molecular beam epitaxy (MBE) method or a metal organic chemical vapor deposition (MOCVD) method.

For example, the epitaxial semiconductor layers 12, 13, and 14 have the following thicknesses, dopants, and impurity concentrations.

| Layer | Thickness (nm) | Dopant | Impurity Concentration (cm$^{-3}$) |
|---|---|---|---|
| i-GaAs | 12 | 600 | — | — |
| i-AlGaAs* | 13 | 50 | — | — |
| n-GaAs | 14 | 100 | Si | $4 \times 10^{18}$ |

*$Al_{0.3}Ga_{0.7}As$

Figure 5:
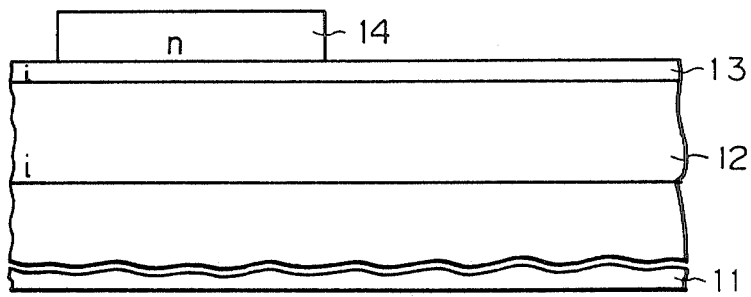
Figure 6:
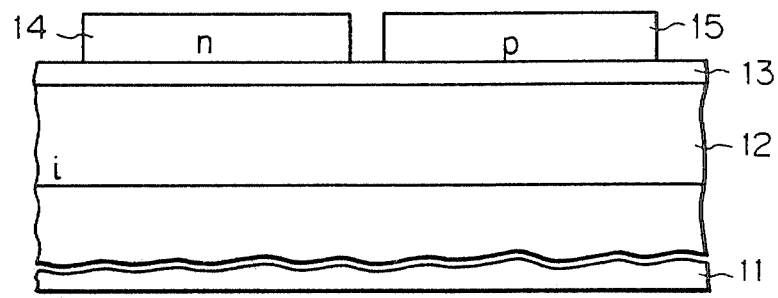

The n-type GaAs control layer 14 is selectively removed by a lithography technique using, e.g., a plasma etching method with a mixed gas of $CCl_2F_2$ and helium (He), as shown in FIG. 5. The remaining GaAs control layer 14 is located on the i-type AlGaAs layer 13 at an n-channel transistor region. A protective film (not shown) of $SiO_2$ or $Si_3N_4$ is formed on the entire surface by a chemical vapor deposition method. The protective film is patterned by a conventional etching method using, e.g., a hydrogen fluoride (HF) solution, to form an opening in which a portion of the i-type AlGaAs buffer layer 13 is exposed. A p-type GaAs control layer 15 (FIG. 6) is selectively grown on the exposed portion of the buffer layer 13 by an MBE method or an MOCVD method. The p-type GaAs layer 15 has a thickness of, e.g., 100 nm, and an impurity concentration of, e.g., $2 \times 10^{19}$ cm$^{-3}$ of beryllium (Be). The remaining protective film is then completely removed.

Figure 7:
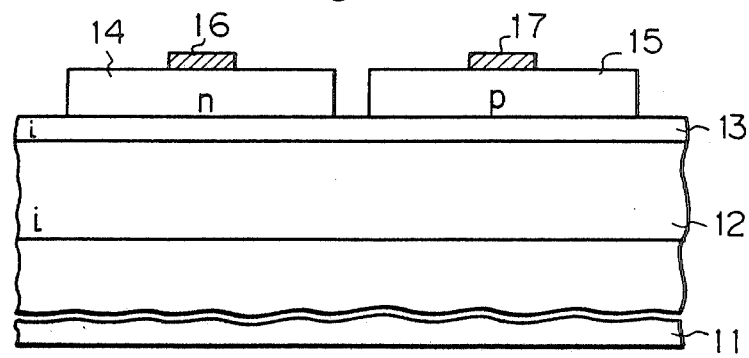

Then a refractory metal film of MoSi, WSi, and the like is formed on the entire surface by a sputtering method or a vacuum evaporation method and is patterned by a conventional lithography technique to form the control electrodes 16 and 17, as shown in FIG. 7. The metal film has a thickness of, e.g., about 600 nm.

Figure 8:
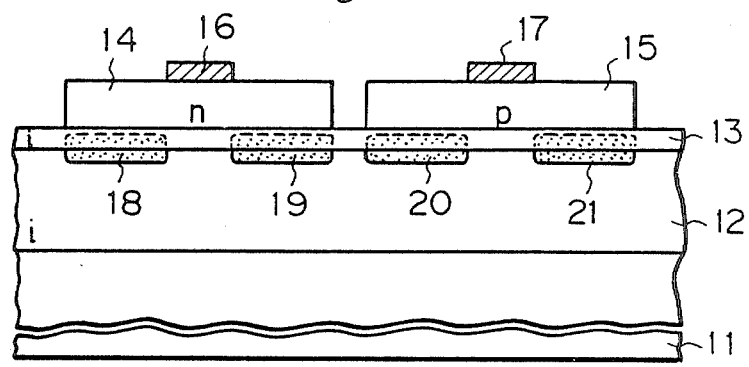

Next a protective film (not shown) of SiO$_2$ or Si$_3$N$_4$ is formed on the entire surface by a CVD method and is patterned by a lithography technique to form two openings corresponding to the source and drain regions 20 and 21. Acceptor impurities (e.g., Be) are introduced into the i-type AlGaAs buffer layer 13 and the i-type GaAs channel layer 12 through the openings by an ion-implantation method, so as to form the p$^+$-type source and drain regions 20 and 21, as shown in FIG. 8. The remaining protective film is then completely removed. Then another protective film (not shown) of SiO$_2$ or Si$_3$N$_4$ is formed on the entire surface by a CVD method and is patterned by a lithography technique to form two openings corresponding to the source and drain regions 18 and 19. Donor impurities (e.g., Si) are introduced into the i-type buffer layer 13 and the i-type channel layer 12 through the openings by an ion-implantation method, so as to form the n$^+$-type source and drain regions 18 and 19. The remaining protective film is also completely removed. Prior to an annealing treatment, a protective film (not shown) of AlN, SiO$_2$, Si$_3$N$_4$ and the like is formed on the entire surface by a CVD method. The annealing treatment is carried out at a temperature of from 700° C. to 900° C. During the annealing, the protective film prevents any out-diffusion of As.

After the removal of the protective film, the n-type GaAs layer 14 and the p-type GaAs layer 15 are selectively etched by a plasma etching method, using a mixed gas of CCl$_2$F$_2$ and He, in such a manner that the control layers 14 and 15 remain under the metal electrodes 16 and 17, as shown in FIG. 2. The i-type AlGaAs buffer layer 13 is selectively etched by a lithography technique (e.g. a wet etching method using an HF solution), so as to form openings 22 in which portions of the n$^+$-type source and drain regions 18 and 19 and the p$^+$-type source and drain regions 20 and 21 are exposed. Using a suitable deposition technique and a suitable lithography technique, the source and drain electrodes 23 and 24 of Au.Ge/Au are formed on the n-type source and drain regions 18 and 19, and the source and drain electrodes 25 and 26 of Au.Zn/Au are formed on the p$^+$-type source and drain regions 20 and 21, as shown in FIG. 2. Finally suitable conductor lines (interconnections) are formed by a conventional technique to complete the semiconductor device (FIG. 2) having the complementary circuit shown in FIG. 3.

Figure 9:
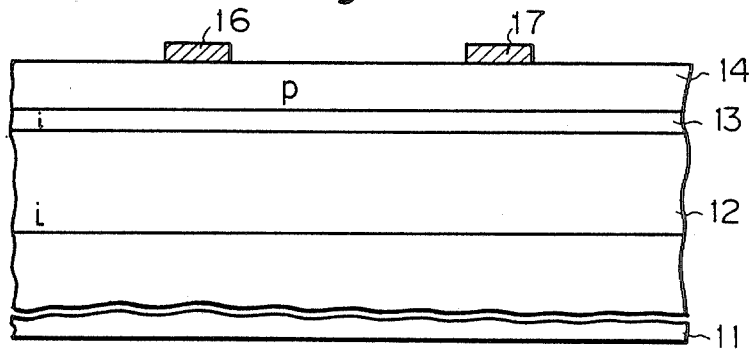
FIG. 9 is a schematic sectional view of the complementary semiconductor device at an intermediate step of production, in accordance with another embodiment of the present invention.

According to the present invention control layers of a complementary semiconductor layer may have the same type of conductivity. Namely, in the device shown in FIG. 2, for example, the n-type conductivity of the control layer 14 can be changed to a p-type conductivity. In this case, the device is produced in a manner similar to the above-mentioned production method except that a common control layer for the n-type and p-type transistors is used. When the GaAs control layer 14 (FIG. 9) is epitaxially formed, acceptor impurities (e.g., Be) are added therein instead of donor impurities (Si) of the dopant. The refractory metal is then deposited on the p-type GaAs layer 14 and is selectively etched (i.e., patterned) by a lithography technique to form the control electrodes 16 and 17, as shown in FIG. 9. After the ion-implantation treatment for formation of the n$^+$-type source and drain regions 18 and 19 and the n$^+$-type source and drain regions 20 and 21, and annealing treatment, the p-type GaAs layer 14 is selectively etched to form the p-type GaAs control layers 14 and 15 under the metal electrodes 16 and 17, as shown in FIG. 2. The succeeding steps are the same as the above-mentioned steps. In this case, production of the semiconductor device is easier than by the above-mentioned production process.

Energy band diagrams of transistors of the complementary semiconductor device are shown in FIGS. 10 to 14.

Figure 10:
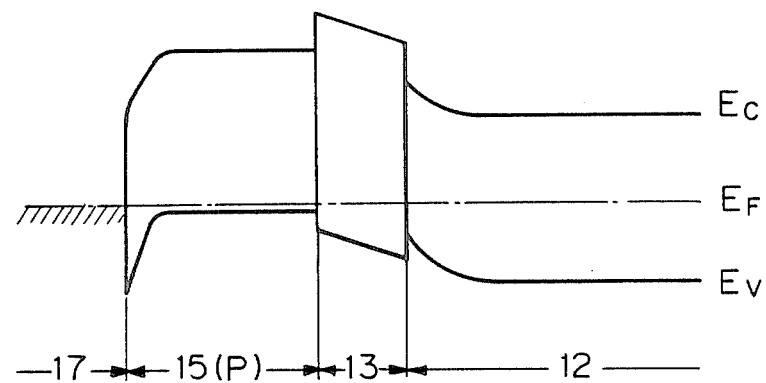
FIG. 10 is an energy band diagram of the p-channel transistor with a p-type GaAs control layer in the thermal equilibrium condition.

FIG. 10 is an energy band diagram of the p-channel transistor of the device, at the line A—A of FIG. 2, under a thermal equilibrium condition. In FIG. 10, the symbols "E$_F$", "E$_V$", and "E$_C$" indicates Fermi level, valence band, and conduction band, respectively. It is possible to vary the surface potential of the i-type GaAs channel layer 12 (and the threshold voltage Vth) by the factors (i.e., thickness and impurity concentration) of the p-type GaAs control layer 15.

Figure 11:
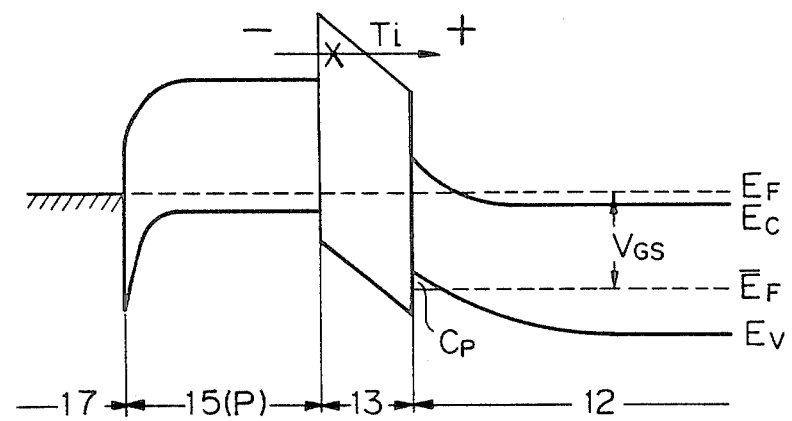
FIG. 11 is an energy band diagram of the p-channel transistor with a p-type GaAs control layer.

When the control electrode 17 is at a negative potential with respect to the p$^+$-type source region 20 in the p-channel transistor, the energy band diagram of FIG. 11 is obtained. In FIG. 11, the symbols "$\overline{E}_F$", "V$_{GS}$", and "C$_P$" indicate the quasi-Fermi level, gate-source voltage, and two-dimensional hole, respectively.

The gate-source voltage V$_{GS}$ is given by:

$$|V_{GS}| = |E_F - \overline{E}_F|$$

Figure 12:
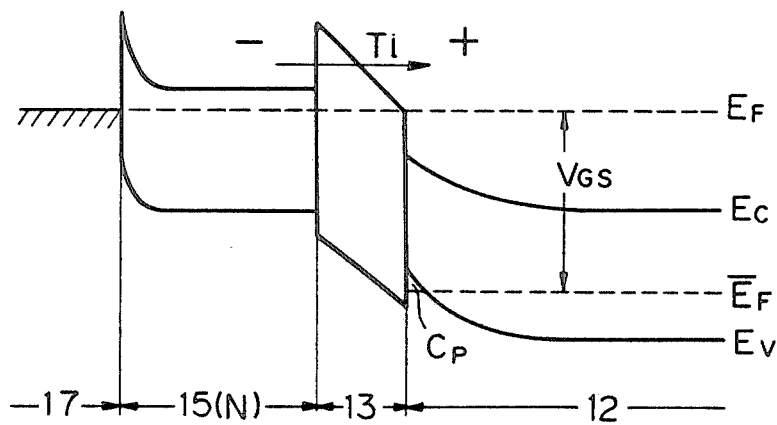
FIG. 12 is an energy band diagram of the p-channel transistor with an n-type GaAs control layer.

In this case, the surface potential of the i-type GaAs channel layer 12 is decreased and holes move into the GaAs channel layer 12 from the p-type source region 20, in such a manner that the holes accumulate near the interface (i.e., heterojunction) between the GaAs channel layer 12 and the i-type AlGaAs buffer layer 13 to generate a two-dimensional hole gas layer (i.e., channel region) 28, as shown in FIG. 2. Although the potential has the polarity as shown in FIG. 11, a tunnel current Ti does not flow, so that the current amplification factor does not decrease.

Where a p-channel transistor is provided with an n-type GaAs control layer 15, when the control electrode 17 is at a negative potential with respect to the p$^+$-type source region 20, the energy band diagram of FIG. 12 is obtained. In this case, the tunnel current Ti flows relatively easily, so that the current amplification factor decreases. However, it is possible to prevent the tunnel current from flowing by increasing the barrier through raising the aluminum content of the i-type AlGaAs buffer layer.

Figure 13:
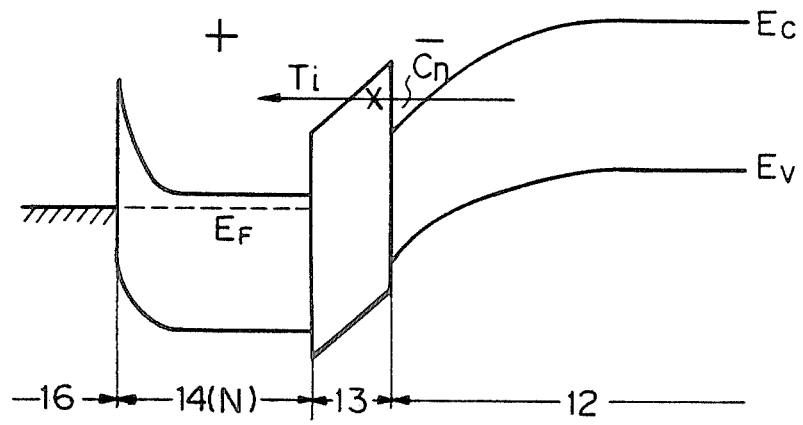
FIG. 13 is an energy band diagram of the n-channel transistor with an n-type GaAs control layer.
Figure 14:
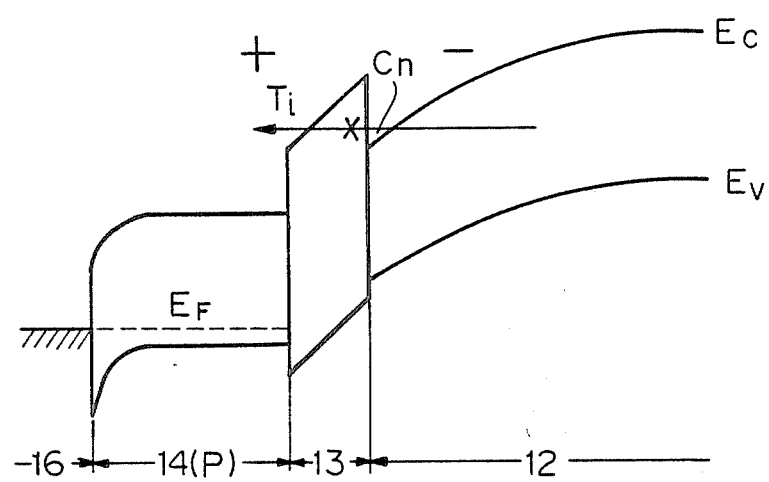
FIG. 14 is an energy band diagram of the n-channel transistor with a p-type GaAs control layer.

When the control electrode 16 is at a positive potential with respect to the n$^+$-type source region 18 in the n-channel transistor of the device shown in FIG. 2, the energy band diagram at the line B—B of FIG. 2 is obtained, as shown in FIG. 13. In this case a two-dimensional electron gas Cn is generated. The tunnel current Ti does not flow as long as there is not a large accumulation of electrons in the channel region 27.

Where an n-channel transistor is provided with a p-type GaAs control layer 14, when the control electrode 16 is at a positive potential with respect to the n$^+$-type source region 18, the energy band diagram of FIG. 14 is obtained. In this case also, the tunnel current Ti does not flow so as long as there is not a large accumulation of electrons.

Therefore, a p-type GaAs control layer is preferable to an n-type GaAs control layer for the p-channel transistor. In the n-channel transistor there is no essential difference between an n-type GaAs control layer and a p-type GaAs control layer. It will be obvious that the present invention is not restricted to the above-mentioned embodiments and that many variations are possible for persons skilled in the art without departing from the scope of the invention. For example, although the heterojunction is formed by a combination of GaAs and AlGaAs layers epitaxially grown thereon in the above-mentioned embodiments, it is possible instead to use combinations of AlGaAs-Ge, GaAs-Ge, CdTe-InSb, GaSb-InAs or the like for the heterojunction.

What is claimed is:

1. A method of producing a semiconductor device comprising the steps of:
   epitaxially forming a channel layer of an undoped single crystalline semiconductor on a semi-insulating single crystalline substrate;
   epitaxially forming a buffer layer of an undoped single crystalline semiconductor on said channel layer;
   epitaxially and selectively forming a first control layer of a doped single crystalline semiconductor on said buffer layer;
   epitaxially and selectively forming a second control layer of a doped single crystalline semiconductor on said buffer layer;
   forming a first control electrode and a second control electrode on said first control layer and said second control layer and said second control layer, respectively;
   forming a pair of impurity regions of a first conductivity type in said channel layer;
   forming a pair of impurity regions of a second conductivity type, opposite said first conductivity type, in said channel layer; and
   forming electrodes on said impurity regions, respectively.

2. A method according to claim 1, wherein said channel layer, said buffer layer, said first control layer, and said second control layer are formed by a molecular beam epitaxy method.

3. A method according to claim 1, wherein said channel layer, said buffer layer, said first control layer, and said second control layer are formed by a metal organic chemical vapor deposition method.

4. A method according to claim 1, wherein said channel layer is made of GaAs and said buffer layer is made of AlGaAs.

5. A method according to claim 1, wherein material of said first control layer is one selected from the group consisting of GaAs and AlGaAs.

6. A method according to claim 1, wherein material of said second control layer is one selected from the group consisting of GaAs and AlGaAs.

7. A method according to claim 1, 5 or 6, wherein said forming step of the first control layer and said forming step of the second control layer are carried out simultaneously by using the same doped single crystalline semiconductor.

* * * * *